(12) United States Patent
Hsu et al.

(10) Patent No.: US 11,817,278 B2
(45) Date of Patent: Nov. 14, 2023

(54) MAGNETIC TYPE KEYSWITCH

(71) Applicant: Darfon Electronics Corp., Taoyuan (TW)

(72) Inventors: Da-Shan Hsu, Taoyuan (TW); Shao-Lun Hsiao, Taoyuan (TW); Chen Yang, Taoyuan (TW); Yu-Chun Hsieh, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 0 days.

(21) Appl. No.: 17/731,288

(22) Filed: Apr. 28, 2022

(65) Prior Publication Data

US 2022/0351920 A1    Nov. 3, 2022

(30) Foreign Application Priority Data

Apr. 29, 2021   (TW) .................................. 110115678

(51) Int. Cl.
*H01H 3/12* (2006.01)
*H03K 17/97* (2006.01)

(52) U.S. Cl.
CPC ............. *H01H 3/125* (2013.01); *H03K 17/97* (2013.01); *H01H 2207/00* (2013.01); *H01H 2221/04* (2013.01)

(58) Field of Classification Search
CPC ........... H01H 2221/04; H01H 2001/54; H01H 2003/00; H01H 2003/008; H01H 2003/12; H01H 2013/00; H01H 2013/02; H01H 2013/04; H01H 2013/52; H01H 2219/00; H01H 2219/004; H01H 2221/00; H01H 2221/022; H01H 2071/048; H01H 3/00; H01H 3/02; H01H 3/12; H01H 3/125; H01H 13/00; H01H 13/04; H01H 13/14; H01H 13/50; H01H 13/70; H01H 2207/00; H03K 17/97
(Continued)

(56) References Cited

U.S. PATENT DOCUMENTS 6,867,680 B1 * 3/2005 Kulle .................... H03K 17/97
                                                  338/12
9,646,786 B1   5/2017 Feng
(Continued)

FOREIGN PATENT DOCUMENTS

CN    204442328 U    7/2015
CN    208226984 U   12/2018
(Continued)

*Primary Examiner* — Anthony R Jimenez
(74) *Attorney, Agent, or Firm* — McClure, Qualey & Rodack, LLP

(57) ABSTRACT

A magnetic type keyswitch includes an actuating member and a switch unit. The actuating member is movable in response to a pressing force. The switch unit includes a circuit board, a Hall sensor electrically connected to the circuit board, and a magnet spaced apart from the Hall sensor by a fixed distance. When the pressing force is not applied, the magnet enables the Hall sensor to output a first voltage, and when the pressing force is applied, the actuating member moves relative to the magnet and the Hall sensor in response to the pressing force, so that the Hall sensor outputs a second voltage different from the first voltage, and the magnetic type keyswitch generates a triggering signal.

18 Claims, 5 Drawing Sheets

(58) Field of Classification Search
USPC .......................................................... 200/341
See application file for complete search history.

(56) References Cited

U.S. PATENT DOCUMENTS

2010/0236911 A1    9/2010  Wild et al.
2020/0204178 A1*  6/2020  Chen .................. H01H 13/7057

FOREIGN PATENT DOCUMENTS

| CN | 109119274 A | 1/2019 |
| CN | 208753194 U | 4/2019 |
| CN | 111180233 A | 5/2020 |
| TW | 201719701 A | 6/2017 |

\* cited by examiner

MAGNETIC TYPE KEYSWITCH

BACKGROUND OF THE INVENTION

1. Field of the Invention

The invention generally relates to a magnetic type keyswitch. Particularly, the invention relates to a magnetic type keyswitch utilizing the Hall effect.

2. Description of the Prior Art

In conventional magnetic type keyswitches, the magnet and the Hall sensor are relatively moved, so that the Hall sensor senses the change of the magnetic field, and the triggering signal is correspondingly generated. However, the conventional magnetic type keyswitches are usually customized to integrate the magnet into the movable component of the keyswitch (e.g. the magnet is embedded to the plunger), resulting in low applicability to different models, and it is difficult to replace the magnets for magnetic strength requirements or adjust the position of the magnets according to space or functional needs.

SUMMARY OF THE INVENTION

It is an object of the invention to provide a magnetic type keyswitch, which generates the triggering signal by utilizing the Hall effect and has the advantage of adjustable triggering point.

It is another object of the invention to provide a magnetic type keyswitch, which has a switch unit composed of a magnet and a Hall sensor and has a fast and accurate triggering function by changing the magnetic field between the magnet and the Hall sensor as the actuating member of the keyswitch moves in response to the pressing force.

It is a further object of the invention to provide a magnetic type keyswitch, which utilizes the actuating member to change the magnetic field between the magnet and the Hall sensor to have the magnet designed as an independent component of the keyswitch, so that the magnet can be selected according to design needs to form an optimum combination with the Hall sensor, enhancing the design freedom and the suitability for various keyswitch structures.

In an embodiment, the invention provides a magnetic type keyswitch including an actuating member and a switch unit. The actuating member is movable in response to a pressing force. The switch unit includes a circuit board, a Hall sensor electrically connected to the circuit board, and a magnet spaced apart from the Hall sensor by a fixed distance. When the pressing force is not applied, the magnet enables the Hall sensor to output a first voltage. When the pressing force is applied, the actuating member moves relative to the magnet and the Hall sensor in response to the pressing force, so that the Hall sensor outputs a second voltage different from the first voltage, and the magnetic type keyswitch generates a triggering signal.

In an embodiment, the magnetic type keyswitch further includes a restoring mechanism disposed over the circuit board. The restoring mechanism includes a casing, a plunger, and an elastic member. The plunger movably couples with the casing, and the plunger is movable from a non-pressed position to a pressed position in response to the pressing force. The elastic member is disposed in the casing, and the elastic member enables the plunger to return to the non-pressed position when the pressing force is released. The actuating member is disposed on the plunger to move with the plunger.

In an embodiment, when the plunger is at the non-pressed position, the actuating member is away from the magnet and the Hall sensor. When the plunger moves to the pressed position, the actuating member moves with the plunger toward between the magnet and the Hall sensor.

In an embodiment, the casing includes an upper casing and a lower casing combined with the upper casing. The upper casing has a through hole and an upper engaging portion. The plunger is movably inserted into the through hole. The lower casing has a lower engaging portion engaging with the upper engaging portion, so that the upper casing is combined with the lower casing.

In an embodiment, the magnet is disposed on the casing or the circuit board.

In an embodiment, the circuit board has an opening corresponding to the actuating member. When the plunger moves to the pressed position, the actuating member moves with the plunger toward between the magnet and the Hall sensor to at least partially extend into the opening.

In an embodiment, the Hall sensor and the magnet are located at the same side or two opposite sides with respect to the circuit board.

In an embodiment, the magnetic type keyswitch further includes a keycap and a support mechanism. The support mechanism is disposed under the keycap and supports the keycap to move relative to the circuit board. The actuating member is disposed on the support mechanism. When the pressing force is applied to the keycap, the keycap drives the support mechanism to move, so that the actuating member moves relative to the magnet and the Hall sensor.

In an embodiment, the support mechanism includes at least one frame and a movable member coupling with the frame. The actuating member is disposed on the movable member. When the pressing force is not applied, the actuating member is away from the Hall sensor. When the pressing force is applied to the keycap, the frame moves with the keycap to drive the movable member to move, so that the actuating member moves toward between the magnet and the Hall sensor.

In an embodiment, the movable member has a first end and a second end with respect to a rotation axis, and the actuating member is disposed at the second end of the movable member. When the pressing force is not applied, the magnet contacts the first end of the movable member to generate a magnetic attraction force to support the keycap to be at a non-pressed position. When the pressing force is applied to the keycap, the movable member rotates about the rotation axis, so that the first end moves away from the magnet, and the actuating member moves toward between the magnet and the Hall sensor when the movable member rotates.

In an embodiment, the actuating member includes a material selected from a group consisting of iron, cobalt, nickel, and alloys thereof.

In another embodiment, the invention provides a magnetic type keyswitch including a support mechanism being movable in response to a pressing force, an actuating member coupling with the support mechanism to move with the support mechanism, and a switch unit including a circuit board, a Hall sensor electrically connected to the circuit board, and a magnet spaced apart from the Hall sensor by a fixed distance, wherein when the pressing force is not applied, the Hall sensor senses a magnetic field between the magnet and the Hall sensor to output a first voltage, and when the pressing force is applied, the support mechanism moves relative to the circuit board to drive the actuating member to move to a position affecting the magnetic field between the magnet and the Hall sensor, so that the Hall sensor outputs a second voltage different from the first voltage, and the magnetic type keyswitch generates a triggering signal.

In an embodiment, the magnetic type keyswitch generates the triggering signal based on the difference between the first voltage and the second voltage.

Compared with the prior art, the magnetic type keyswitch of the invention utilizes the magnet and the Hall sensor as a switch unit and changes the magnetic field between the magnet and the Hall sensor by using the actuating member, which can be disposed at any suitable movable component of the keyswitch, so as to provide a fast and accurate triggering function. Moreover, the magnetic type keyswitch of the invention has the magnet designed as a component independent from other components of the keyswitch, enhancing the design freedom and the suitability for various keyswitch structures.

DETAILED DESCRIPTION OF THE PREFERRED EMBODIMENT

The invention provides a magnetic type keyswitch, which utilizes the actuating member to change the magnetic field between the magnet and the Hall sensor to provide a triggering mechanism based on the Hall effect. The magnetic type keyswitch can be applied to any pressing type input device (e.g. keyboard) or integrated to any suitable electronic devices (e.g. keybuttons or keyboard equipped in portable devices or laptop computers). The magnetic type keyswitch has the magnet designed as a component independent from other components of the keyswitch to facilitate the selection of optimum combination with the Hall sensor according to design needs and enhance the design freedom and the suitability for various keyswitch structures. Hereinafter, the structure and operation of the magnetic type keyswitch of the invention will be described in detail with reference to the drawings.

Figure 1:
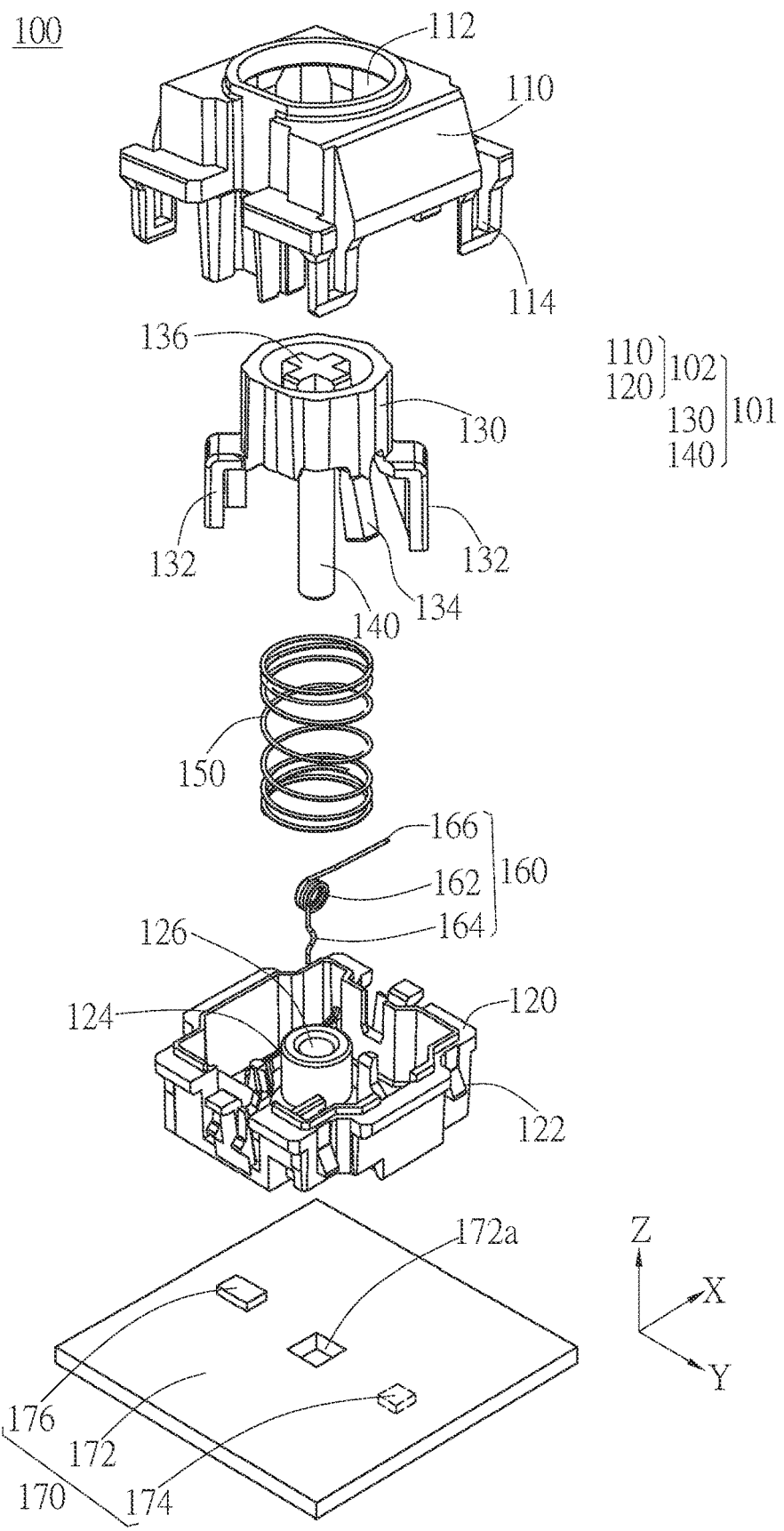
FIG. 1 is a schematic exploded view of the magnetic type keyswitch in a first embodiment of the invention.
Figure 2:
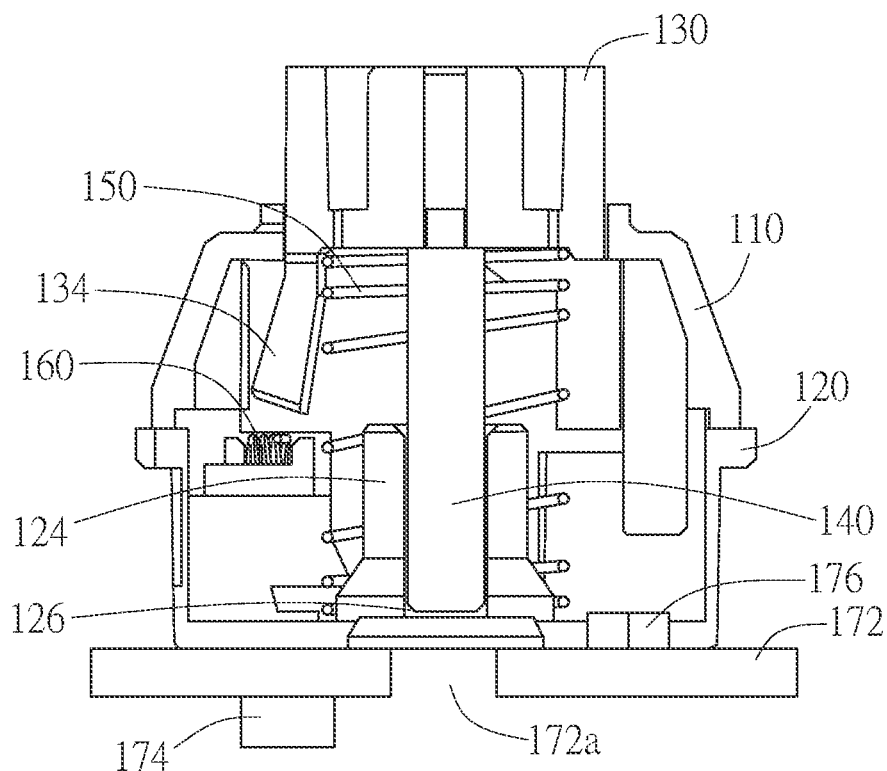
FIG. 2 is a schematic cross-sectional view of the magnetic type keyswitch of FIG. 1 in the non-pressed state.
Figure 3:
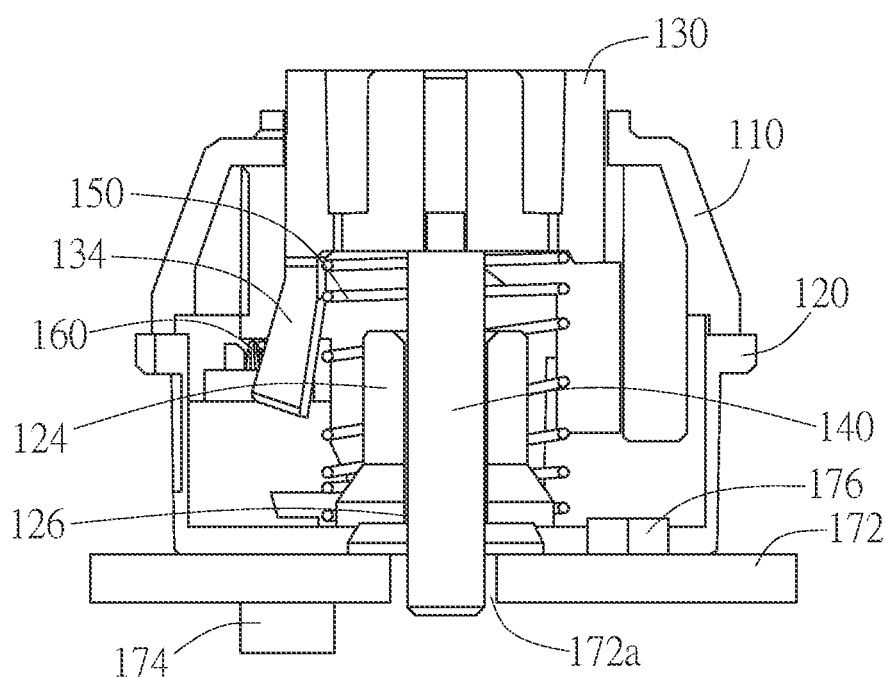
FIG. 3 is a schematic cross-sectional view of the magnetic type keyswitch of FIG. 1 in the pressed state.

FIG. 1 is a schematic exploded view of the magnetic type keyswitch 100 in a first embodiment of the invention. FIG. 2 is a schematic cross-sectional view of the magnetic type keyswitch 100 of FIG. 1 in the non-pressed state. FIG. 3 is a schematic cross-sectional view of the magnetic type keyswitch 100 of FIG. 1 in the pressed state. As shown in FIG. 1 to FIG. 3, in an embodiment, the magnetic type keyswitch 100 includes an actuating member 140 and a switch unit 170. The actuating member 140 is movable in response to a pressing force. The switch unit 170 includes a circuit board 172, a Hall sensor 174, and a magnet 176. The Hall sensor 174 is electrically connected to the circuit board 172, and the magnet 176 is spaced apart from the Hall sensor 174 by a fixed distance. When the pressing force is not applied, the magnet 176 enables the Hall sensor 174 to output a first voltage. When the pressing force is applied, the actuating member 140 moves relative to the magnet 176 and the Hall sensor 174 in response to the pressing force, so that the Hall sensor 174 outputs a second voltage different from the first voltage, and the magnetic type keyswitch 100 generates a triggering signal.

Specifically, the magnet 176 can produce a magnet field, and the Hall sensor 174 is a sensor that senses the existence and the strength of the magnetic field through the Hall effect. The output voltage of the Hall sensor is proportional to the strength of the magnetic field. The Hall sensor 174 and the magnet 176 can be located at the same side or two opposite sides with respect to the circuit board 172. The fixed distance between the magnet 176 and the Hall sensor 174 can be defined as a predetermined distance that the Hall sensor 174 can output a predetermined voltage (e.g. first voltage) when the magnetic type keyswitch 100 is in the non-pressed state. In other words, the fixed distance between the magnet 176 and the Hall sensor 174 can be any appropriate distance, which allows the Hall sensor 174 to sense the existence of the magnetic field of the magnet 176 and a certain degree of strength of the magnetic field. The fixed distance can be determined according to the level of the magnet 176, the sensitivity of the Hall sensor, and the desired triggering distance.

The actuating member 140 is preferably disposed on any movable component of the keyswitch, as appropriate. For example, the actuating member 140 can be disposed on the plunger 130 of the restoring mechanism 101 of FIG. 1 or on the support mechanisms of FIG. 4 and FIG. 7, so that the actuating member 140 can move relative to the Hall sensor 174 and the magnet 176 in response to the pressing force applied by the user (described later). The actuating member 140 preferably includes a material capable of affecting the magnetic field between the magnet 176 and the Hall sensor 174, so the movement of the actuating member 140 relative to the magnet 176 and the Hall sensor 174 will cause the Hall sensor 174 to output different voltages. For example, the actuating member 140 preferably includes a material selected from a group consisting of iron, cobalt, nickel, and alloys thereof (e.g. Fe/Mn/Zn alloy, Fe/Ni/Zn alloy), and the actuating member 140 can be attached to the movable component of the keyswitch by any suitable manner, such as adhering, engaging, screwing, but not limited thereto. In another embodiment, when the movable component of the keyswitch is formed by injection-molding, a corresponding portion of the movable component can be doped with magnetically conductive materials (e.g. iron, cobalt, nickel, or an alloy thereof), so the actuating member 140 is integrally formed with the movable component of the keyswitch, and the actuating member 140 is made of a composite material including plastics and magnetic conductors.

As shown in FIG. 1 to FIG. 3, in the first embodiment, the magnetic type keyswitch 100 further includes a restoring mechanism 101, which is configured to enable the magnetic type keyswitch 100 to return form the pressed state to the non-pressed state after being pressed. Specifically, the restoring mechanism 101 is disposed over the circuit board 172, and the restoring mechanism 101 includes a casing 102, a plunger 130, and an elastic member 150. In this embodiment, the actuating member 140 is disposed on the plunger 130 to move along with the plunger 130, and the Hall sensor 174 is disposed under the circuit board 172 and electrically connected to the switch circuit of the circuit board 172. In other words, the Hall sensor 174 and the casing 102 are disposed at two opposite sides with respect to the circuit board 172. According to practical applications, the magnet 176 can be disposed on the circuit board 172 or the casing 102 and maintain the above fixed distance from the Hall sensor 174. For example, the magnet 176 can be positioned on the circuit board 172 or the casing 102 by adhesives, engaging means, or any suitable positioning mechanism to ensure that the distance between the magnet 176 and the Hall sensor 174 is fixed. In this embodiment, the Hall sensor 174 and the magnet 176 are located at two opposite sides with respect to the circuit board 172. For example, the Hall sensor 174 is located under the circuit board 172, and the magnet 176 is located over the circuit board 172, but not limited thereto. In other embodiments, according to practical applications, the Hall sensor 174 and the magnet 176 can be located at the same side, such as both under the circuit board 172 or both above the circuit board 172.

The plunger 130 movably couples with the casing 102. The plunger 130 is movable from a non-pressed position to a pressed position in response to the pressing force. The elastic member 150 is disposed in the casing 102. When the pressing force is released, the elastic member 150 enables the plunger 130 to return to the non-pressed position. Specifically, the casing 102 includes an upper casing 110 and a lower casing 120, and the lower casing 120 is combined with the upper casing 110. The upper casing 110 has a through hole 112 and an upper engaging portion 114. The plunger 130 is movably inserted into the through hole 112. The lower casing 120 has a lower engaging portion 122. The lower engaging portion 122 is adapted to engage with the upper engaging portion 114, so that the upper casing 110 is combined with the lower casing 120. The lower casing 120 is preferably a base extending along the X-axis, Y-axis, and Z-axis directions, and the upper casing 110 is a cover corresponding to the lower casing 120. The lower casing 120 is combined with the upper casing 110 to form the casing 102 with an accommodation space for accommodating, for example, the elastic member 150. For example, the lower engaging portion 122 of the lower casing 120 can be a hook-like portion, and the upper engaging portion 114 of the upper casing 110 is a corresponding structure with a hole. As such, the lower casing 120 and the upper casing 110 can be combined along the Z-axis direction by engaging the hook-like portion with the hole. The through hole 112 of the upper casing 110 preferably corresponds to the top portion of the plunger 130 in shape, so that the plunger 130 can be movably inserted into the through hole 112 from the lower side of the upper casing 110 with the top portion of the plunger 130 protruding from the through hole 112. For example, the plunger 130 is preferably a barrel-like object, and the actuating member 140 extends from the lower side of the barrel-like object. The plunger 130 can further have a restricting portion 132 and a coupling portion 136. The restricting portion 132 is preferably disposed on the periphery of the lower end of the barrel-like object, and the coupling portion 136 is preferably disposed on the top portion of the plunger 130.

The actuating member 140 is disposed corresponding to the switch unit 170. The actuating member 140 is preferably a post extending downward from the center bottom of the barrel-like object and is configured to trigger the switch unit 170 to generate the triggering signal. Specifically, the projection of the actuating member 140 on the circuit board 172 is preferably located between the magnet 176 and the Hall sensor 174, so the movement (e.g. approaching) of the actuating member 140 relative to the magnet 176 and the Hall sensor 174 will cause the Hall sensor to output a different voltage (e.g. a voltage different from the first voltage). As described above, the actuating member 140 can be a component attached to or coupling with the plunger 130 by any suitable connecting methods (e.g. adhering, engaging, screwing). Alternatively, the actuating member 140 can be an integral portion of the plunger 130 formed by the injection-molding. The shape of the actuating member 140 can be determined according to practical applications, such as column, plate, block, or any suitable shape. The restricting portion 132 can be two pillars extending radially outward from two opposite sides of the plunger 130, so that the distance between the two pillars is larger than the size of the through hole 112 to prevent the plunger 130 from escaping from the upper casing 110 when the plunger 130 moves relative to the upper casing 110 upwardly. The coupling portion 136 can a cross-shaped protrusion formed on the top portion of the plunger 130 and is configured to couple a keycap (not shown), but not limited thereto. In other embodiments, the coupling portion 136 can have other configurations (e.g. a coupling hole) to couple the keycap.

In this embodiment, the elastic member 150 is preferably a spring, and the lower casing 120 has a holding portion 124, so the elastic member 150 can be positioned by the holding portion 124. For example, the holding portion 124 can be a ring-shaped wall extending from the bottom of the lower casing 120 toward the upper casing 110. One end of the spring (i.e., the elastic member 150) can be sleeved on the ring-shaped wall (i.e., the holding portion 124), and the actuating member 140 connected to the bottom of the plunger 130 is inserted into the channel 126 surrounded by the ring-shaped wall. The other end of the spring is against the bottom of the plunger 130, and the top portion of the plunger 130 protrudes from the through hole 112 of the upper casing 110. As such, when the pressing force is applied, the plunger 130 along with the actuating member 140 moves toward the lower casing 120 to compress the spring. When the pressing force is released, the spring provides the restoring force to enable the plunger 130 along with the actuating member 140 (and keycap) to move away from the lower casing 120 to the position before the pressing force is applied.

In an embodiment, the magnetic type keyswitch 100 can optionally include a tactile resilient member 160 to provide the tactile feedback. In this embodiment, the tactile feedback member 160 is disposed in the casing 102, and the tactile feedback member 160 includes a positioning portion 164 and an extending arm 166. The extending arm 166 extends corresponding to a cam portion 134 (described later), and the positioning portion 164 is positioned on the lower casing 120. Specifically, the tactile feedback member 160 can be implemented as a torsion spring. The positioning portion 164 and the extending arm 166 of the tactile feedback member 160 respectively extend from two opposite ends of the torsion spring. For example, the positioning portion 164 and the extending arm 166 are two rods extending from two opposite ends of the spring body 162, and the angle between the extending directions of the two rods is preferably not more than 120 degrees. Corresponding to the disposition of the tactile resilient member 160, the plunger 130 can have a cam portion 134. The cam portion 134 can be disposed on the periphery of the lower end of the barrel-like object, and the restricting portion 132 and the cam portion 134 are disposed along the periphery of the lower end of the barrel-like object. For example, the cam portion 134 can be an angular block, which extends downward. When the pressing force is applied, the cam portion 134 can interact with the extending arm 166 of the tactile resilient member 160 to provide the tactile feedback.

Referring to FIG. 2 and FIG. 3, the operation of the magnetic type keyswitch 100 of the first embodiment is illustrated. As shown in FIG. 2, when the pressing force is not applied (i.e., the keycap is not pressed), the Hall sensor 174 senses the existence of the magnetic field of the magnet 176 and outputs the first voltage which corresponds to the sensed magnetic field strength. For example, when the plunger 130 is at the non-pressed position, the actuating member 140 is away from the magnet 176 and the Hall sensor 174, so the actuating member 140 has smaller (or predetermined) influence or no influence on the magnetic field of the magnet 176, and the Hall sensor 174 correspondingly outputs the first voltage. As shown in FIG. 3, when the pressing force is applied (i.e., the keycap is pressed), the plunger 130 moves to the pressed position, and the actuating member 140 moves with the plunger 130 toward between the magnet 176 and the Hall sensor 174, so the Hall sensor 174 outputs a second voltage, which is different from the first voltage. Specifically, the actuating member 140 moves downward along the channel 126 of the lower casing 120 toward the Hall sensor 174 and the magnet 176 to a position that the magnetic field of the magnet 176 is affected, so the Hall sensor 174 senses the changed magnetic field and correspondingly outputs the second voltage. In this embodiment, the actuating member 140 preferably includes a magnetically conductive material, so the actuating member 140 can provide the shielding effect between the magnet 176 and the Hall sensor 174, and the second voltage outputted by the Hall sensor 174 is smaller than the first voltage. The magnetic type keyswitch 100 can generate the triggering signal based on the change of voltage outputted by the Hall sensor 174. From another aspect, when the actuating member 140 moves downward closer to the magnet 176 and the Hall sensor 174, the shielding effect is enhanced, so the voltage outputted by the Hall sensor 174 becomes smaller as the distance that the actuating member 140 moves downward longer. As such, the magnetic type keyswitch 100 can set the trigger point based on the difference between the second voltage and the first voltage outputted by the Hall sensor 174. For example, the larger the value of difference is, the longer the moving distance of the actuating member 140 is, so the later the trigger is. As such, the advantage of adjusting the trigger point according to practical applications can be achieved.

Moreover, as shown in FIG. 3, the circuit board 172 has an opening 172a, and the opening 172a is disposed corresponding to the actuating member 140. When the plunger 130 moves to the pressed position, the actuating member 140 moves with the plunger 130 toward between the magnet 176 and the Hall sensor 174 to at least partially extend into the opening 172a, so that the downward moving distance of the actuating member 140 can be increased to facilitate the thinning design of the keyswitch, but not limited thereto. According to practical applications, the circuit board 172 may not have the opening 172a for the actuating member 140 to extend thereinto.

Figure 4:
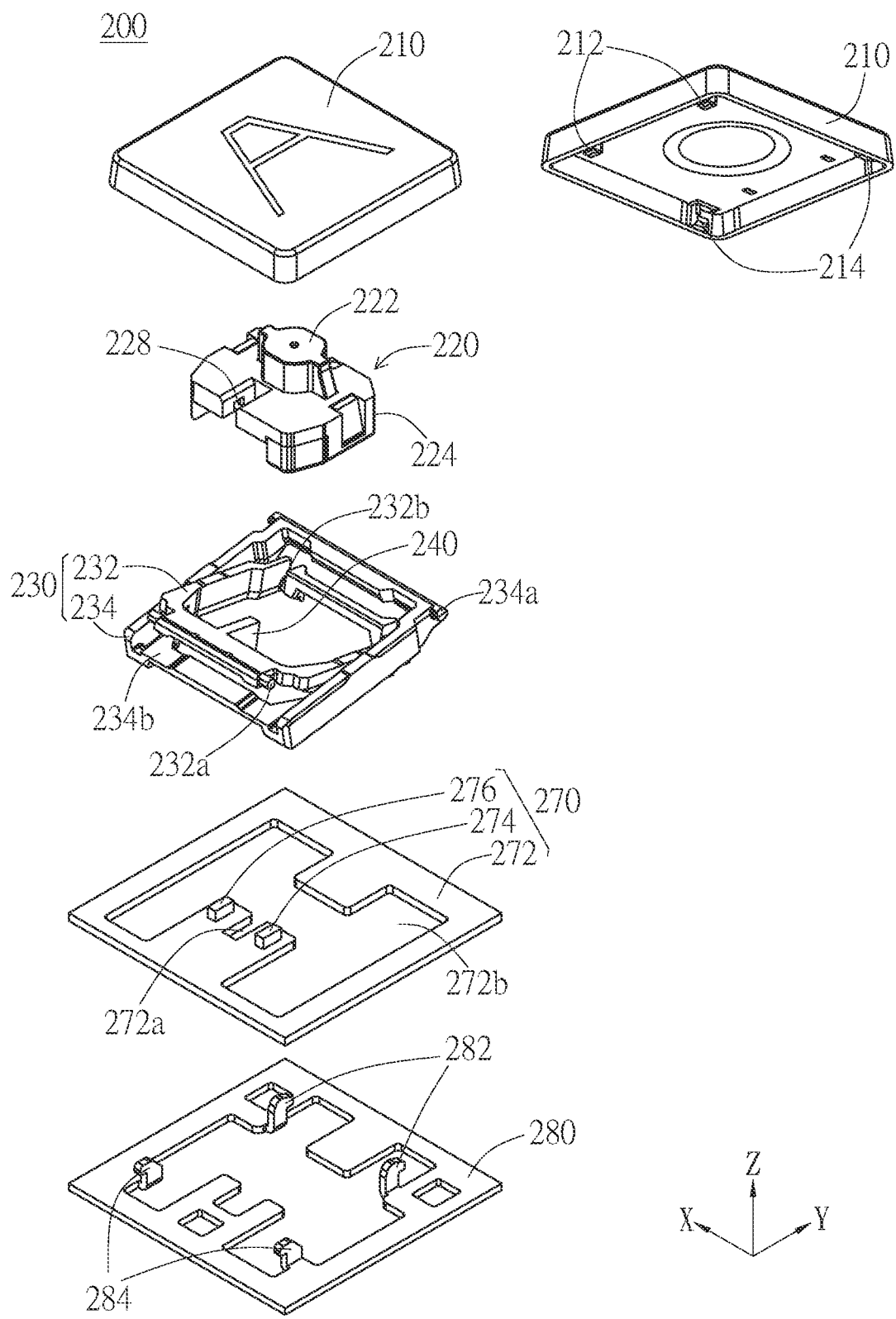
FIG. 4 is a schematic exploded view of the magnetic type keyswitch in a second embodiment of the invention.
Figure 5:
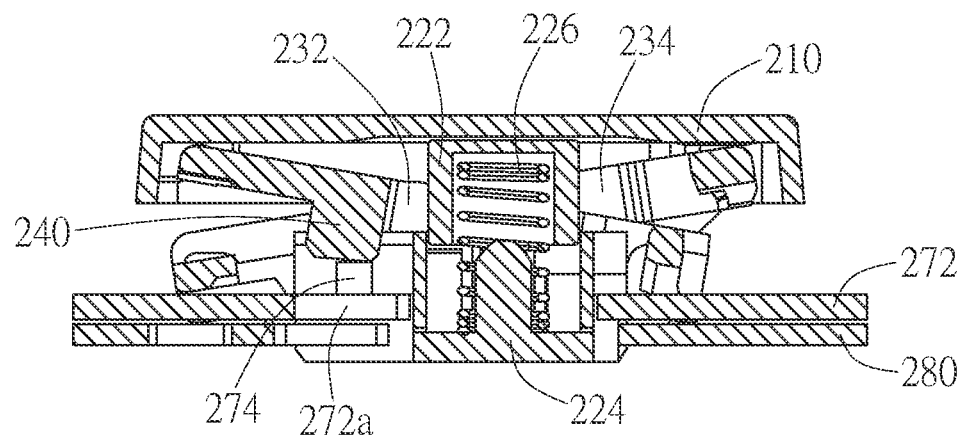
FIG. 5 is a schematic cross-sectional view of the magnetic type keyswitch of FIG. 4 in the non-pressed state.
Figure 6:
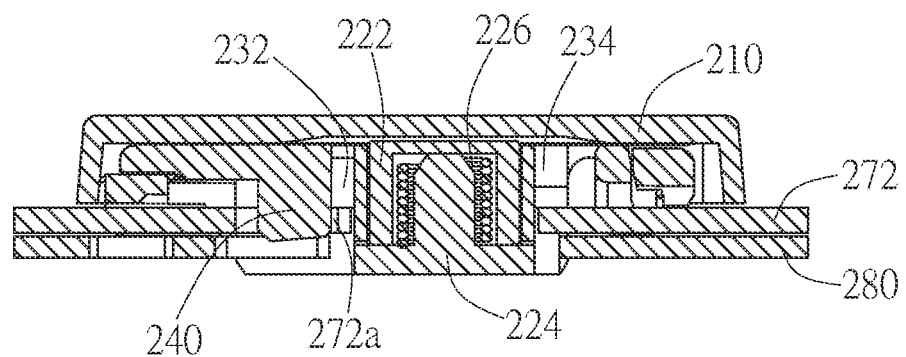
FIG. 6 is a schematic cross-sectional view of the magnetic type keyswitch of FIG. 4 in the pressed state.

FIG. 4 is a schematic exploded view of the magnetic type keyswitch 200 in a second embodiment of the invention. FIG. 5 is a schematic cross-sectional view of the magnetic type keyswitch 200 of FIG. 4 in the non-pressed state. FIG. 6 is a schematic cross-sectional view of the magnetic type keyswitch 200 of FIG. 4 in the pressed state. As shown in FIG. 4, in the second embodiment, in addition to the switch unit 270 (i.e., a circuit board 272, a Hall sensor 274, and a magnet 276), the magnetic type keyswitch 200 further includes a keycap 210 and a support mechanism 230, and an actuating member 240 is disposed on the support mechanism 230 (e.g. the first frame 232). The structure and function of the switch unit 270 of FIG. 4 are similar to those of the switch unit 170 of FIG. 1, can be referred to related descriptions of FIG. 1, and will not elaborate again. In this embodiment, the support mechanism 230 is disposed under the keycap 210 and supports the keycap 210 to move relative to the circuit board 272. The actuating member 240 is disposed on the support mechanism 230 to be movable with the support mechanism 230. When the pressing force is applied to the keycap 210, the keycap 210 drives the support mechanism 230 to move, so that the actuating member 240 moves relative to the magnet 276 and the Hall sensor 274. The magnetic type keyswitch 200 can further include a baseplate 280, which is adapted to enhance the structural strength of the keyswitch. The baseplate 280 can be disposed above or under the circuit board 272 (e.g. under the circuit board 272 in this embodiment), and the support mechanism 230 is movably connected to the baseplate 280 and the keycap 210, but not limited thereto. When the circuit board 272 can provide sufficient support strength, the magnetic type keyswitch 200 may not need the baseplate 280, and the support mechanism 230 is movably connected to the circuit board 272 and the keycap 210.

Specifically, the support mechanism 230 includes a first frame 232 and a second frame 234. The first frame 232 is pivotally connected to the inner side of the second frame 234 to form a scissor-like support mechanism. The first frame 232 and the second frame 234 are preferably rectangular frames formed by injection-molding, and the first frame 232 and the second frame 234 are rotatably connected through the connection mechanism of pivot and pivotal hole. Two opposite ends of each of the first frame 232 and the second frame 234 can be respectively movably connected to the keycap 210 and the baseplate 280 to stably support the keycap 210 to move relative to the baseplate 280. For example, the keycap end 232a of the first frame 232 can be rotatably connected to the coupling member 212 of the keycap 210, and the baseplate end 232b of the first frame 232 can be movably connected to the connection member 282 of the baseplate 280. Similarly, the keycap end 234a of the second frame 234 can be rotatably connected to the coupling member 214 of the keycap 210, and the baseplate end 234b of the second frame 234 can be movably connected to the connection member 284 of the baseplate 280. As such, the support mechanism 230 can stably support the keycap 210 to move up-down relative to the baseplate 280 (or the circuit board 272).

In this embodiment, the actuating member 240 is disposed at the inner side of the first frame 232. The actuating member 240 can be a protrusion, which extends from the first frame 232 toward the inner side of the first frame 232 and is preferably located on the inner side of the keycap end 232a of the first frame 232. The actuating member 240 is preferably an L-shaped protrusion. Similar to the previous embodiment, the actuating member 240 is preferably made of a material capable of affecting the magnetic field between the magnet 276 and the Hall sensor 274, so the movement of the actuating member 240 relative to the magnet 276 and the Hall sensor 274 will cause the Hall sensor 274 to output different voltages. The actuating member 240 preferably includes a material selected from a group consisting of iron, cobalt, nickel, and alloys thereof (e.g. Fe/Mn/Zn alloy, Fe/Ni/Zn alloy), and the actuating member 240 can be attached to the first frame 232 by any suitable manner, such as adhering, engaging, screwing. Alternatively, when the first frame 232 is formed by injection-molding, a corresponding portion (e.g. protrusion portion) of the first frame 232 can be doped with magnetically conductive materials (e.g. iron, cobalt, nickel, or an alloy thereof), so the actuating member 240 is integrally formed with the first frame 232, and the actuating member 240 is made of a composite material including plastics and magnetic conductors.

The circuit board 272 is preferably disposed on the baseplate 280. The circuit board 272 has an opening 272b, which allows the connection members 282 and 284 of the baseplate 280 to pass therethrough to connect the support mechanism 230. The magnet 276 and the Hall sensor 274 are disposed on the circuit board 272 and spaced apart from each other by a fixed distance. For example, the circuit board 272 can have a groove 272a (e.g. opening). The magnet 276 and the Hall sensor 274 are disposed at two opposite sides of the groove 272a. The magnetic type keyswitch 200 can further include a restoring mechanism 220, which is adapted to enable the magnetic type keyswitch 200 to return from the pressed state to the non-pressed state after being pressed. In this embodiment, the restoring mechanism 220 can include a plunger 222, a casing 224, and an elastic member 226 (shown in FIG. 5). The structure and function of the restoring mechanism 220 can be referred to related descriptions of the restoring mechanism 101 of FIG. 1. The difference between the restoring mechanism 101 of FIG. 1 and the restoring mechanism 220 of FIG. 4 in that the plunger 222 of the restoring mechanism 220 is not provided with the actuating member (e.g. the actuating member 140), and the tactile resilient member (e.g. 160 shown in FIG. 1) can be omitted. In such a case, the plunger 222 may not have the cam portion (e.g. 134 shown in FIG. 1). It is noted that the restoring mechanism 220 may have other configurations and is not limited to the illustrated embodiment. For example, in other embodiments, the restoring mechanism 220 of the magnetic type keyswitch 200 may be implemented as a rubber dome, magnets, or any suitable mechanism capable of providing the restoring force to enable the keycap 210 to return to the non-pressed position.

Referring to FIG. 5 and FIG. 6, the operation of the magnetic type keyswitch 200 of the second embodiment is illustrated. As shown in FIG. 5, when the pressing force is not applied (i.e., the keycap 210 is not pressed), the actuating member 240 is away from the Hall sensor 274, and the Hall sensor 274 senses the existence of the magnetic field of the magnet 276 and outputs the first voltage which corresponds to the sensed magnetic field strength. Specifically, when the pressing force is not applied, the actuating member 240 is disposed corresponding to the channel 228 (shown in FIG. 4) of the casing 224, and the channel 228 of the casing 224 is aligned with the groove 272a of the circuit board 272. In such a configuration, the actuating member 240 has smaller (or predetermined) influence or no influence on the magnetic field of the magnet 276, and the Hall sensor 274 correspondingly outputs the first voltage. As shown in FIG. 6, when the pressing force is applied (i.e., the keycap 210 is pressed), the keycap 210 pushes the plunger 222 and compresses the elastic member 226, and the first frame 232 and the second frame 234 move with the keycap 210 to drive the actuating member 240 to move downward between the magnet 276 and the Hall sensor 274, so the Hall sensor 274 outputs a second voltage. In other words, the actuating member 240 moves downward toward the Hall sensor 274 and the magnet 276 to a position that the magnetic field of the magnet 276 is affected. For example, the actuating member 240 moves to be at least partially located on a virtual connecting line between the magnet 276 and the Hall sensor 274, so the Hall sensor 274 senses the changed magnetic field and correspondingly outputs the second voltage, which is smaller than the first voltage, and the magnetic type keyswitch 200 generates a triggering signal. Similarly, when the actuating member 240 moves downward between the magnet 276 and the Hall sensor 274, the actuating member 240 can at least partially extend into the groove 272a of the circuit board 272.

Figure 7:
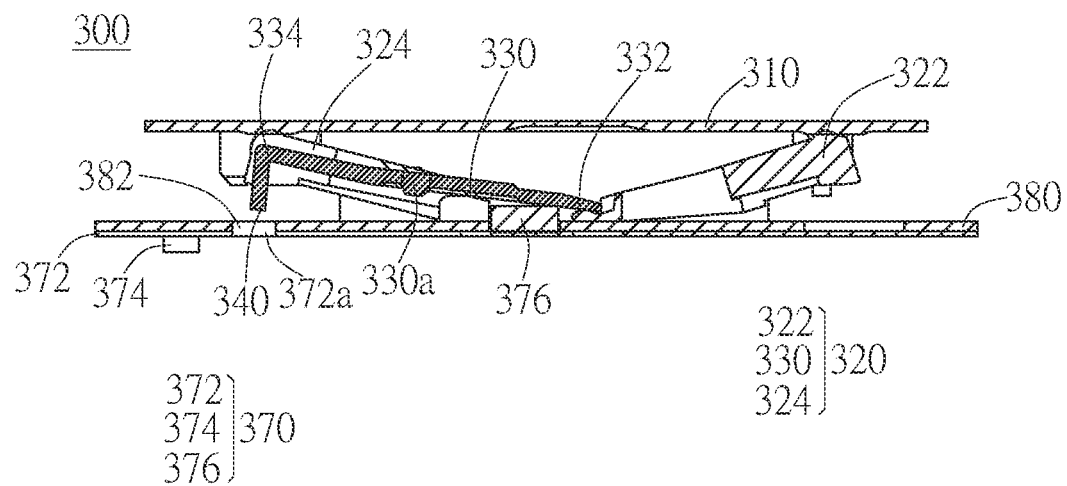
FIG. 7 is a schematic cross-sectional view of the magnetic type keyswitch in a third embodiment of the invention in the non-pressed state.
Figure 8:
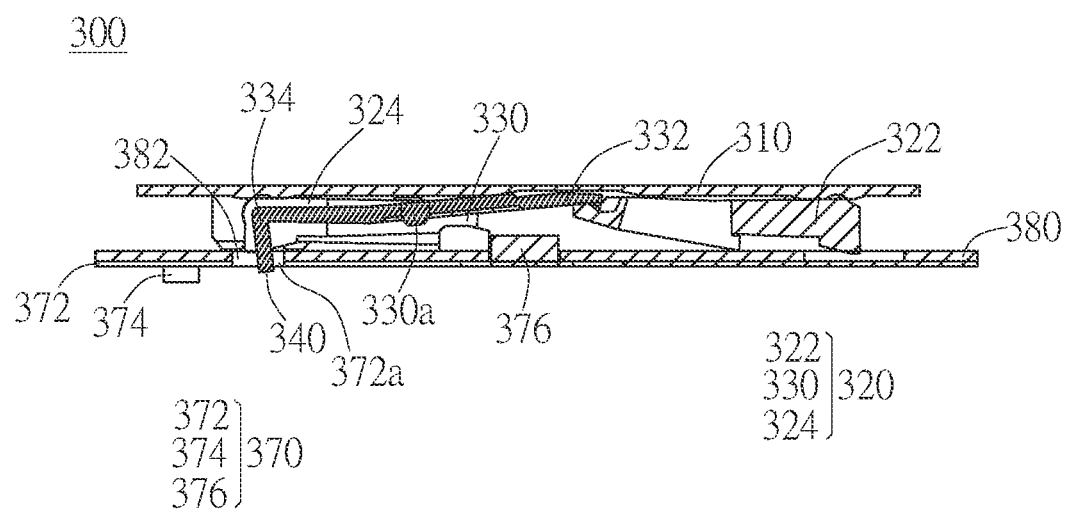
FIG. 8 is a schematic cross-sectional view of the magnetic type keyswitch of FIG. 7 in the pressed state.

FIG. 7 is a schematic cross-sectional view of the magnetic type keyswitch 300 in a third embodiment of the invention in the non-pressed state. FIG. 8 is a schematic cross-sectional view of the magnetic type keyswitch 300 of FIG. 7 in the pressed state. As shown in FIG. 7, in the third embodiment, in addition to the switch unit 370 (i.e., a circuit board 372, a Hall sensor 374, and a magnet 376), the magnetic type keyswitch 300 further includes a keycap 310 and a support mechanism 320, and an actuating member 340 is disposed on the component of the support mechanism 320 (e.g. movable member 330). The structure and function of the switch unit 370 of FIG. 7 are similar to those of the switch unit 170 of FIG. 1, can be referred to related descriptions of FIG. 1, and will not elaborate again. In this embodiment, the support mechanism 320 is disposed under the keycap 310 and supports the keycap 310 to move relative to the circuit board 372. The support mechanism 320 includes at least one frame (e.g. 322, 324) and the movable member 330. The movable member 330 couples with the frame (e.g. 322 or 324). In this embodiment, the actuating member 340 is disposed on the movable member 330 of the support mechanism 320. When the pressing force is not applied, the actuating member 340 is away from the Hall sensor 374. When the pressing force is applied to the keycap 310, the frame (e.g. 322, 324) moves with the keycap 310 to drive the movable member 330 to move, so that the actuating member 340 moves toward between the magnet 376 and the Hall sensor 374.

The magnetic type keyswitch 300 can further include a baseplate 380, which is adapted to enhance the structural strength of the keyswitch. The baseplate 380 can be disposed above or under the circuit board 372 (e.g. over the circuit board 372 in this embodiment), and the support mechanism 320 is movably connected to the baseplate 380 and the keycap 310, but not limited thereto. When the circuit board 372 can provide sufficient support strength, the magnetic type keyswitch 300 may not need the baseplate 380, and the support mechanism 320 is movably connected to the circuit board 372 and the keycap 310.

Specifically, the support mechanism 320 includes a first frame 322 and a second frame 324. The first frame 322 and the second frame 324 are disposed at two opposite sides of the keycap 310, respectively. Two opposite ends of each of the first frame 322 and the second frame 324 are respectively movably connected to the keycap 310 and the baseplate 380 to form a butterfly type support mechanism, which stably supports the keycap 310 to move relative to the baseplate 380. The magnet 376 is disposed between the first frame 322 and the second frame 324. The magnet 376 can be located on the baseplate 380. Alternatively, the magnet 76 can protrude from the opening of the baseplate 380 and is positioned on the baseplate 380 by a positioning mechanism. The movable member 330 is disposed corresponding to the magnet 376. The movable member 330 couples with the first frame 322 and is rotatably connected to the second frame 324. Specifically, the movable member 330 has a first end 332 and a second end 334 with respect to the rotation axis 330a. In other words, the first end 332 is closer to the first frame 322 than the rotation axis 330a, and the second end 334 is farther from the first frame 322 than the rotation axis 330a. The first end 332 of the movable member 330 couples with the first frame 322, so the movable member 330 is in contact with the magnet 376 to generate the magnetic attraction force for supporting the keycap 310 at the non-pressed position. The actuating member 340 is disposed on the second end 334 of the movable member 330. For example, the actuating member 340 extends downward from the second end 334 of the movable member 330 toward the baseplate 380 and moves up-down in response to the rotation of the movable member 330.

Referring to FIG. 7 and FIG. 8, the operation of the magnetic type keyswitch 300 of the third embodiment is illustrated. As shown in FIG. 7, when the pressing force is not applied (i.e., the keycap 310 is not pressed), the actuating member 340 is away from the Hall sensor 374, and the Hall sensor 374 senses the existence of the magnetic field of the magnet 376 and outputs the first voltage which corresponds to the sensed magnetic field strength. In other words, when the pressing force is not applied, the magnet 376 is in contact with the first end 332 of the movable member 330, and the magnetic attraction force is generated to support the keycap 310 at the non-pressed position. In such a configuration, the actuating member 340 at the second end 334 is away from the Hall sensor 374 and the magnet 376, so the actuating member 340 has smaller (or predetermined) influence or no influence on the magnetic field of the magnet 376, and the Hall sensor 374 correspondingly outputs the first voltage. As shown in FIG. 8, when the pressing force is applied (i.e., the keycap 310 is pressed), the first frame 322 and the second frame 324 move with the keycap 310 to drive the movable member 330 to move, so the actuating member 340 moves toward between the magnet 376 and the Hall sensor 374, and the Hall sensor 374 outputs the second voltage. Specifically, when the keycap 310 is pressed, the first frame 322 rotates in response to the downward movement of the keycap 310 to lift the first end 332 of the movable member 330 upward. In other words, the movable member 330 rotates counter-clockwise about the rotation axis 330a, and the first end 332 of the movable member 330 moves away from the magnet 376. At the same time, in response to the rotation of the movable member 330, the second end 334 of the movable member 330 moves toward between the Hall sensor 374 and the magnet 376. In other words, the second end 334 moves downward to drive the actuating member 340 to move downward toward the Hall sensor 374 and the magnet 376 to a position that the magnetic field of the magnet 376 is affected. As such, the Hall sensor 374 senses the changed magnetic field and correspondingly outputs the second voltage, which is smaller than the first voltage. Similarly, the circuit board 372 and the baseplate 380 can have openings 372a and 382, respectively. The openings 372a and 382 communicate with each other. When the first end 332 of the movable member 330 rotates away from the magnet 376, the actuating member 340 driven by the movable member 330 moves downward between the magnet 376 and the Hall sensor 374 to at least partially extend into the opening 382 and then into the opening 372a.

The magnetic type keyswitch of the invention utilizes the magnet and the Hall sensor as a switch unit and changes the magnetic field between the magnet and the Hall sensor by using the actuating member, which can be disposed at any suitable movable component of the keyswitch, so as to provide a fast and accurate triggering function. Moreover, the magnetic type keyswitch of the invention has the magnet designed as a component independent from other components of the keyswitch, not only enhancing the flexibility of selecting an optimum combination of magnet and Hall sensor, but also promoting the design freedom and the applicability to various keyswitch structures.

Although the preferred embodiments of the invention have been described herein, the above description is merely illustrative. The preferred embodiments disclosed will not limit the scope of the invention. Further modification of the invention herein disclosed will occur to those skilled in the respective arts and all such modifications are deemed to be within the scope of the invention as defined by the appended claims.

What is claimed is:

1. A keyswitch, comprising:
an actuating member being movable along a moving path in response to a pressing force; and
a switch unit comprising a circuit board, a Hall sensor electrically connected to the circuit board, and a magnet,
wherein the magnet is spaced apart from the Hall sensor by a fixed distance during movement of the actuating member,
wherein in a cross-sectional view, the moving path extends across an area between the magnet and the Hall sensor,
wherein when the pressing force is not applied, the magnet enables the Hall sensor to output a first voltage, and when the pressing force is applied, the actuating member moves along the moving path across the area between the magnet and the Hall sensor in response to the pressing force, so that the Hall sensor outputs a second voltage different from the first voltage, and the keyswitch generates a triggering signal.

2. The keyswitch of claim 1, wherein the Hall sensor and the magnet are located at the same side or two opposite sides with respect to the circuit board.

3. The keyswitch of claim 1, further comprising a restoring mechanism disposed over the circuit board, wherein the restoring mechanism comprises:
a casing;
a plunger movably coupling with the casing, the plunger being movable from a non-pressed position to a pressed position in response to the pressing force; and
an elastic member disposed in the casing, the elastic member enabling the plunger to return to the non-pressed position when the pressing force is released,
wherein the actuating member is disposed on the plunger to move with the plunger.

4. The keyswitch of claim 3, wherein when the plunger is at the non-pressed position, the actuating member is away from the magnet and the Hall sensor; when the plunger moves to the pressed position, the actuating member moves with the plunger toward between the magnet and the Hall sensor.

5. The keyswitch of claim 3, wherein the casing comprises an upper casing and a lower casing combined with the upper casing; the upper casing has a through hole and an upper engaging portion; the plunger is movably inserted into the through hole; the lower casing has a lower engaging portion engaging with the upper engaging portion, so that the upper casing is combined with the lower casing.

6. The keyswitch of claim 3, wherein the magnet is disposed on the casing or the circuit board.

7. The keyswitch of claim 3, wherein the circuit board has an opening corresponding to the actuating member; when the plunger moves to the pressed position, the actuating member moves with the plunger toward between the magnet and the Hall sensor to at least partially extend into the opening.

8. The keyswitch of claim 1, further comprising a keycap and a support mechanism, wherein the support mechanism is disposed under the keycap and supports the keycap to move relative to the circuit board; the actuating member is disposed on the support mechanism; when the pressing force is applied to the keycap, the keycap drives the support mechanism to move, so that the actuating member moves relative to the magnet and the Hall sensor.

9. The keyswitch of claim 8, wherein the support mechanism comprises at least one frame and a movable member coupling with the frame; the actuating member is disposed on the movable member, wherein:
when the pressing force is not applied, the actuating member is away from the Hall sensor; and
when the pressing force is applied to the keycap, the frame moves with the keycap to drive the movable member to move, so that the actuating member moves toward between the magnet and the Hall sensor.

10. The keyswitch of claim 9, wherein the movable member has a first end and a second end with respect to a rotation axis, and the actuating member is disposed at the second end of the movable member, wherein:
when the pressing force is not applied, the magnet contacts the first end of the movable member to generate a magnetic attraction force to support the keycap to be at a non-pressed position; and
when the pressing force is applied to the keycap, the movable member rotates about the rotation axis, so that the first end moves away from the magnet, and the actuating member moves toward between the magnet and the Hall sensor when the movable member rotates.

11. The keyswitch of claim 1, wherein the actuating member comprises a material selected from a group consisting of iron, cobalt, nickel, and alloys thereof.

12. A keyswitch, comprising:
a support mechanism being movable in response to a pressing force;
an actuating member coupling with the support mechanism to move with the support mechanism along a moving path; and
a switch unit comprising a circuit board, a Hall sensor electrically connected to the circuit board, and a magnet spaced apart from the Hall sensor by a fixed distance, so a relative position of the magnet to the Hall sensor remains unchanged during movement of the actuating member,
wherein in a cross-sectional view, the moving path extends across an area between the magnet and the Hall sensor,
wherein when the pressing force is not applied, the Hall sensor senses a magnetic field between the magnet and the Hall sensor to output a first voltage, and when the pressing force is applied, the support mechanism moves relative to the circuit board to drive the actuating member to move along the moving path across the area between the magnet and the Hall sensor, so that the Hall sensor outputs a second voltage different from the first voltage, and the keyswitch generates a triggering signal.

13. The keyswitch of claim 12, wherein the circuit board has a groove corresponding to the actuating member; the magnet and the Hall sensor disposed at two opposite sides of the groove; when the actuating member moves toward between the magnet and the Hall sensor, the actuating member at least partially extends into the groove.

14. The keyswitch of claim 12, wherein the keyswitch generates the triggering signal based on a difference between the first voltage and the second voltage.

15. The keyswitch of claim 12, wherein the support mechanism comprises two frames pivotally connected to each other to form a scissor-like support mechanism, and the actuating member couples with one of the two frames.

16. The keyswitch of claim 15, wherein the actuating member comprises a magnetically conductive material, and the actuating member is disposed at an inner side of the one of the two frames.

17. The keyswitch of claim 12, wherein the support mechanism comprises two frames and a movable member coupling with at least one of the two frames, and the actuating member is disposed on the movable member.

18. The keyswitch of claim 17, wherein the actuating member comprises a magnetically conductive material, and the actuating member extends from one end of the movable member toward the circuit board.

* * * * *